(12) United States Patent
Lindsey et al.

(10) Patent No.: US 7,834,573 B2
(45) Date of Patent: Nov. 16, 2010

(54) WINDING FAULT DETECTION SYSTEM

(75) Inventors: Robert W. Lindsey, Washington, IL (US); Robert R. Sychra, Washington, IL (US)

(73) Assignee: Caterpillar Inc, Peoria, IL (US)

( * ) Notice: Subject to any disclaimer, the term of this patent is extended or adjusted under 35 U.S.C. 154(b) by 136 days.

(21) Appl. No.: 11/882,242

(22) Filed: Jul. 31, 2007

(65) Prior Publication Data
US 2009/0033357 A1 Feb. 5, 2009

(51) Int. Cl.
*G01R 31/02* (2006.01)
*H02H 3/04* (2006.01)
*H02K 11/00* (2006.01)

(52) U.S. Cl. .......................... 318/490; 318/434; 361/33

(58) Field of Classification Search .................. 318/490, 318/434; 361/33
See application file for complete search history.

(56) References Cited

U.S. PATENT DOCUMENTS

| | | | |
|---|---|---|---|
| 4,187,525 A | 2/1980 | Nagura et al. | |
| 4,540,922 A | 9/1985 | Horvath et al. | |
| 4,618,810 A | 10/1986 | Hagerman et al. | |
| 5,574,346 A | 11/1996 | Chavan et al. | |
| 6,812,586 B2 * | 11/2004 | Wacknov et al. | 290/52 |
| 7,005,833 B2 | 2/2006 | Adams | |
| 7,091,724 B2 | 8/2006 | Heinzmann et al. | |
| 7,176,651 B2 | 2/2007 | Kifuku et al. | |
| 7,479,756 B2 * | 1/2009 | Kasunich et al. | 318/732 |
| 2006/0055419 A1 | 3/2006 | Paulson et al. | |
| 2007/0120694 A1 | 5/2007 | Lindsey et al. | |
| 2008/0304189 A1 * | 12/2008 | Tang et al. | 361/33 |

* cited by examiner

*Primary Examiner*—Walter Benson
*Assistant Examiner*—Erick Glass
(74) *Attorney, Agent, or Firm*—Finnegan, Henderson, Farabow, Garrett & Dunner LLC

(57) ABSTRACT

A control system is disclosed. The control system has an electric machine coupled to provide power to or receive power from a DC bus and a controller in communication with the electric machine and the DC bus. The controller is configured to receive a voltage from the DC bus, compare the voltage from the DC bus to a characteristic indicative of a fault of at least one winding of the electric machine, and take a precaution based on the comparison.

17 Claims, 4 Drawing Sheets

WINDING FAULT DETECTION SYSTEM

TECHNICAL FIELD

This disclosure relates generally to electric machines, and, more particularly, to a winding fault detection system.

BACKGROUND

Machines such as, for example, passenger vehicles, trains, marine vessels, construction equipment, excavating machines, etc., often have a combustion engine to power various operations of the machine. In the past, the power output of the combustion engine was usually mechanically coupled to traction devices (e.g., wheels or tracks) to propel the machine. In response to ever more stringent emissions requirements and design goals, however, different propulsion arrangements have been developed. Combustion engines are now commonly used to drive an electric machine, such as an inductance machine, a permanent magnet machine, or switched reluctance machine, which operates in a generating mode to energize a DC bus that is used to power an electric motor at the traction devices. This arrangement is advantageous because it permits running the combustion engine at a constant speed (i.e., a "sweet spot") that minimizes harmful emissions and/or maximizes fuel economy.

During operation of such machines, an undesirable situation arises when the insulation of an energized winding fails and the electrical source is shorted to the housing of the generator or motor and/or the chassis of the machine. For example, damage to the machine or systems thereof may result. As such, there is a need to detect winding faults and take precautions in response thereto.

One winding fault detection circuit is described in U.S. Pat. No. 5,574,346 issued to Chavan et al. on Nov. 12, 1996 (the '346 patent). The winding fault detection circuit monitors voltage drops in the phase windings of a motor and compares the voltage drops with reference voltages to determine if the motor is out of normal operating range parameters and if a valid fault exists. If a valid fault exists, a circuit driving the motor is interrupted.

Although the fault detection circuit of the '346 patent may interrupt operation when a winding fault is detected, it may be overly complex, costly, and difficult to implement. For example, the fault detection circuit requires comparator logic to monitor the windings of each phase of the motor and to compare the voltage drops across each winding to a high reference voltage and a low reference voltage. In addition, the outputs of the comparator logic must be sequentially selected and provided to fault logic in accordance with the excitation of respective phase windings and the angular position of the motor. Only at this point may analysis be made as to whether a winding fault is present.

The present disclosure is directed to overcoming one or more of the problems set forth above.

SUMMARY OF THE INVENTION

One aspect of the disclosure is directed to a control system. The control system may include an electric machine coupled to provide power to or receive power from a DC bus. The control system may further include a controller in communication with the electric machine and the DC bus. The controller may be configured to receive a voltage from the DC bus, compare the voltage from the DC bus to a characteristic indicative of a fault of at least one winding of the electric machine, and take a precaution based on the comparison.

Another aspect of the disclosure is directed to a method of detecting a winding fault. The method may include providing power to or receiving power from an electric machine via a DC bus, and receiving a voltage from the DC bus. The method may further include comparing the voltage from the DC bus to a characteristic indicative of a fault of at least one winding of the electric machine, and taking a precaution based on the comparison.

DETAILED DESCRIPTION

Figure 1:
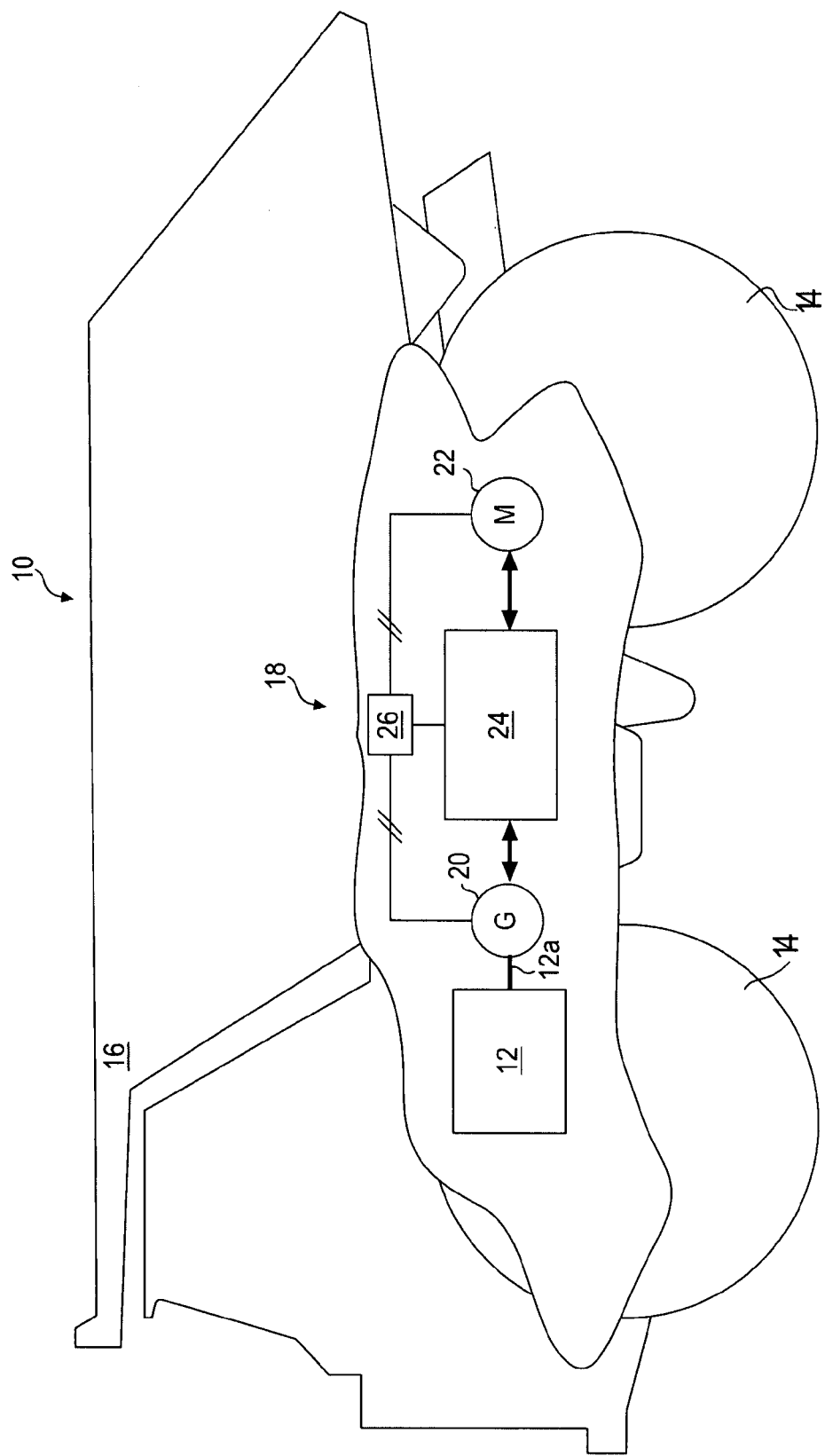
FIG. 1 shows a diagrammatic and schematic representation of an exemplary disclosed power train.

FIG. 1 illustrates an exemplary machine 10. Machine 10 may embody a stationary or mobile machine configured to perform some type of operation associated with a particular industry, such as mining, construction, farming, transportation, etc., and operates between or within work environments (e.g., construction site, mine site, power plants, on-highway applications, etc.). For example, machine 10 may embody a mobile machine, such as an excavating machine, an on- or off-road haul truck, a passenger vehicle, or a marine vessel. Machine 10 may alternatively embody a stationary machine, such as a generator set, a pumping mechanism, or another suitable stationary operation-performing machine.

Machine 10 may include a power source 12, such as an internal combustion engine (e.g., a diesel engine, a gasoline engine, or a gaseous fuel-powered engine) that combusts a mixture of fuel and air to generate a mechanical power output, which may be embodied in the rotation of a crankshaft 12*a*. The mechanical output of crankshaft 12*a* may be used to power operations of machine 10. For example, the mechanical power output may be used to propel the movement of machine 10 by way of traction devices 14 and/or to drive the movement of a work tool 16, among other things.

Machine 10 may also include an electric drive train 18 to convert the mechanical power output into a form suitable to power the various operations of machine 10. Drive train 18 may include a first electric machine 20 connected to power and/or be powered by a second electric machine 22 via a circuit 24. Drive train 18 may also include a fault detection controller 26 operatively coupled to first electric machine 20, second electric machine 22, and/or circuit 24, In one embodiment, first electric machine 20 may be a generator coupled to crankshaft 12*a* to receive at least some of the mechanical power output from power source 12. Generator 20 may convert the mechanical power to electrical power, and be coupled to provide the electrical power to second electric machine 22 (e.g., a generator, a motor, or a motor/generator) through circuit 24. Second electric machine 22 may be a motor configured to receive the electrical power from circuit 24 and to propel machine 10 by way of traction devices 14 and/or to move work tool 16. It is to be appreciated, however, that first electric machine 20 may alternatively embody a motor or a motor/generator, and second electric machine 22 may embody a generator or a motor/generator, respectively, and drive train 18 may operate in reverse to drive power source 12, if desired. Additionally, generator 20 and/or motor 22 may be equipped with one or more sensors configured to sense an angular speed (i.e., rotational speed) thereof and generate a signal indicative of the speed, which may be communicated to controller 26 for processing.

Figure 2:
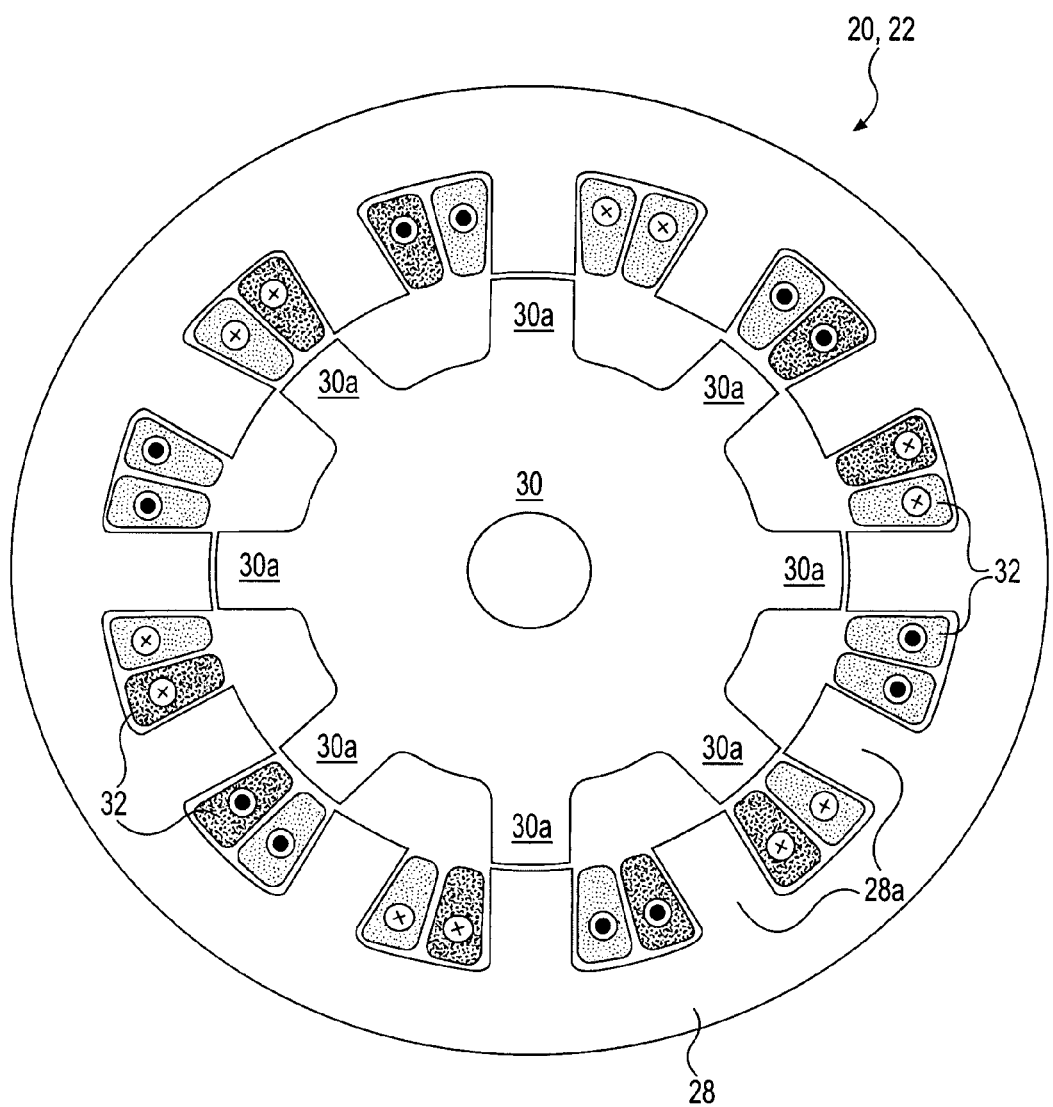
FIG. 2. shows a sectional representation of an exemplary disclosed electric machine for use with the power train of FIG. 1.

FIG. 2 shows a sectional view of exemplary electric machines 20 and 22. Electric machines 20 and 22 may be for example, inductance machines, permanent magnet machines, or switched reluctance machines configured to operate in a generating mode and/or a motoring mode. Electric machines 20 and 22 may include a stator 28 and a rotor 30. Stator 28 may include a plurality of stator poles 28a. Each of stator poles 28a may be wound by a winding 32. Likewise, rotor 30 may include a plurality of rotor poles 30a. It is to be appreciated that the number and arrangement of stator poles 28a and rotor poles 30a shown in FIG. 2 are exemplary only, and any desired arrangement may be used.

Rotor 30 of generator 20 may be coupled to crankshaft 12a to receive at least a portion of the mechanical power output from power source 12. That is, crankshaft 12a may cause rotor 30 to rotate. The magnetic flux generated by the rotation of rotor 30 may induce electrical power in stator windings 32. Particularly, the torque required and supplied by power source 12 to rotate rotor 30 of generator 20 against its tendency to magnetically align each of its rotor poles 30a with stator poles 28a may generate a magnetic flux that energizes windings 32 with electric power. The electric power may be provided to motor 22 via circuit 24. Likewise, the electric power may energize windings 32 of motor 22 and generate a magnetic flux, causing rotor 30 of motor 20 to rotate and propel machine 10. Rotors 30 of generator 20 and motor 22 may be directly coupled to crankshaft 12a and traction devices 14, respectively, or indirectly through a transmission (not shown), a torque converter (not shown), or another coupling means known in the art.

Figure 3:
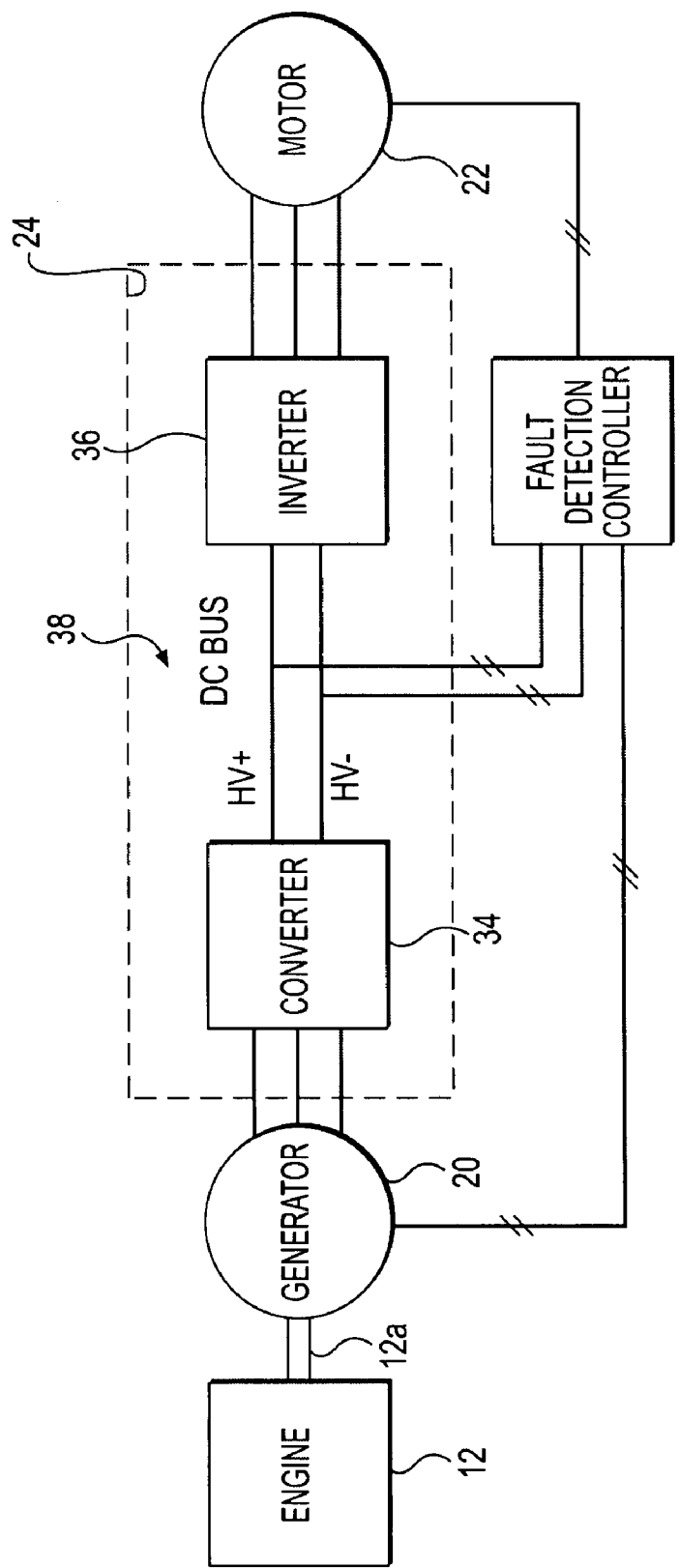
FIG. 3 shows a schematic view of an exemplary disclosed winding fault detection control system for use with the power train of FIG. 1.

As shown by FIG. 3, circuit 24 may include a DC bus 38 connected to generator 20 through a converter 34, and to motor 22 through an inverter 36. Specifically, the converter 34 may be coupled to windings 32 of generator 20 on the one hand, and to a positive high voltage line $HV_+$ and a negative high voltage line $HV_-$ on the other hand. In one embodiment, $HV_+$ and $HV_-$ may have values of about +300V and −300V, respectively, during machine operation.

Converter 34 may be configured to transform a voltage associated with windings 32 to a predetermined level and/or form. For instance, converter 34 may convert the voltage of windings 32 to a level and/or form appropriate to energize DC bus 38. Converter 34 may include an upconverter (i.e., a device to transfer a voltage level to a higher voltage level) and/or a downconverter (i.e., a device to transfer a voltage level to a lower voltage level). Moreover, converter 34 may include a programmable interface (not shown) that allows a user to specify a desired power level or conversion ratio. Converter 34 may include any type of power converter such as, for example, a DC/DC converter, an AC/DC converter, a DC/AC converter, a pulse converter, or another type of power converter known in the art. Converter 34 may be selectively controlled by a predetermined control algorithm (not shown), if desired. For example, the algorithm may selectively control converter 34 as to energize DC bus 38 in response to a monitored voltage level of DC bus 38 and/or an angular position of the rotor 30 of generator 20.

Likewise, inverter 36 may be coupled to DC bus 38 and to motor 22 and configured to transform the voltage of DC bus 38 to a level and/or form appropriate to drive motor 22. Specifically, inverter 36 may be coupled to windings 32 of motor 22 on the one hand, and to positive high voltage line $HV_+$ and negative high voltage line $HV_-$ of DC bus 38 on the other hand. Inverter 36 may include an upconverter (i.e., a device to transfer a voltage level to a higher voltage level) and/or a downconverter (i.e., a device to transfer a voltage level to a lower voltage level). Moreover, inverter 36 may include a programmable interface (not shown) that allows a user to specify a desired voltage level or conversion ratio. Inverter 36 may include any type of power converter such as, for example, a DC/DC converter, an AC/DC converter, a DC/AC converter, a pulse converter, or any other type of power converter known in the art. Inverter 36 may be selectively controlled by a predetermined control algorithm (not shown), if desired. For example, the algorithm may selectively control inverter 36 to provide sufficient power to motor 22 based on varying load demands and/or an angular position of the rotor of motor 22.

Figure 4:
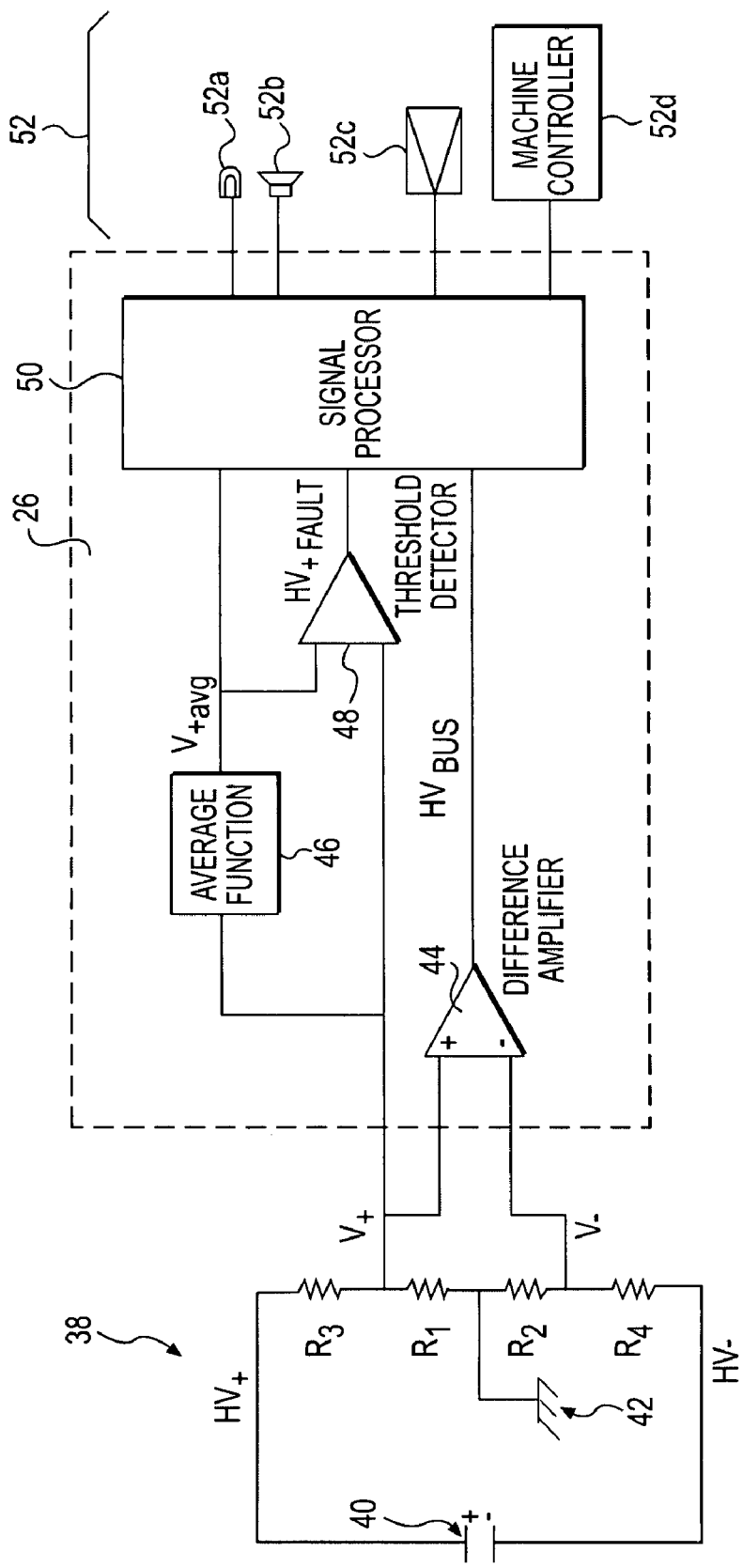
FIG. 4 shows a detailed schematic view of the winding fault detection control system of FIG. 3.

Turning to FIG. 4, DC bus 38 may include a storage device 40, such as one or more capacitors, batteries, and/or other charge-storing devices known in the art. Storage device 40 may be connected to positive high-voltage bus line $HV_+$ and to negative high-voltage bus line $HV_-$ with reference to a machine frame ground 42. Ground 42 may be, for example, a frame and/or a chassis of machine 10, a housing of generator 20 and/or motor 22, or another suitable ground reference or an electrical connection thereto. During operation, electric power produced by generator 20 may be provided to energize storage device 40 by converter 34 via high-voltage bus line $HV_+$ and negative high-voltage bus line $HV_-$. Likewise, electric power stored by storage device 40 may be drawn therefrom and provided to motor 22 via high-voltage bus line $HV_+$ and negative high-voltage bus line $HV_-$ by inverter 36.

DC bus 38 may also include resistors $R_1$-$R_4$ arranged as shown in FIG. 4. $R_1$ and $R_2$ may be of equal resistance and provide means to balance and reference high voltage bus lines $HV_+$ and $HV_-$ equally around frame ground 42. In one embodiment, $R_1$ and $R_2$ may have a resistance of about 5.1 kΩ. $R_3$ and $R_4$ may have resistances of about 1 MΩ. In this manner, a voltage divider between $HV_+$ and ground 42 may be provided by $R_1$ and $R_3$. Likewise, a voltage divider between $HV_-$ and ground 42 may be provided by $R_2$ and $R_4$. $V_+$ may be the voltage drop across resistor $R_1$, while $V_-$ may be the voltage drop across $R_2$. It is noted that because the resistances of $R_3$ and $R_4$ may be much greater than the resistances of $R_2$ and $R_1$, the voltages of $V_+$ and $V_-$ may be substantially smaller than, albeit proportional to and indicative of, the voltages of $HV_+$ and $HV_-$, respectively. In one aspect, the values of $R_1$-$R_4$ may be chosen to ensure that the voltage levels of $V_+$ and $V_-$ are appropriate for processing by fault detection controller 26. It is to be appreciated, however, that the values of $R_1$-$R_4$ are exemplary only and may alternatively have other values suitable for practice of the disclosure. Further, a different arrangement including more or less resistors of different values may alternatively be used, if desired.

Fault detection controller 26 may be, for example, an electronic control module (ECM), or another processor capable of executing, and/or or outputting command signals in response to received and/or stored data to affect, among other things, the winding fault detection processes disclosed herein. Controller 26 may include computer-readable storage, such as read-only memories (ROM), random-access memories (RAM), and/or flash memory; secondary storage device(s), such as a tape-drive, an optical disk drive, and/or magnetic disk drive; microprocessor(s) (CPU); and/or any other components for running an application. The microprocessor(s) may comprise any suitable combination of commercially-available or specially-constructed microprocessors for controlling system operations. As such, controller 26 may include instructions and/or data stored as hardware, software, and/or firmware within the memory, secondary storage device(s), and/or microprocessor(s). Alternatively or additionally, controller 26 may include and/or be associated with various other suitably arranged hardware and/or software components. For example, controller 26 may further include power supply circuitry, signal conditioning circuitry, solenoid driver circuitry, amplifier circuitry, timing circuitry, filtering circuitry, switches, and/or other types of circuitry, if desired.

In one exemplary embodiment, controller 26 may include a difference amplifier 44, an averaging function 46, a threshold detector 48, and a signal processor 50. The respective outputs of difference amplifier 44, averaging function, and threshold detector 48 may be provided to a signal processor 50. Signal processor 50 may be configured to initiate a precaution in response to the outputs, which will be discussed in further detail below.

Referring to FIG. 4, controller 26 may comprise any detection means to indicate the total voltage of DC bus 38 based on the output of the difference amplifier 44 (e.g., a isolation amplifier, voltage transducer, analog to digital converter, a software routine, etc.) Difference amplifier 44 may indicate a total voltage magnitude of DC bus 38 without regard to the balance of DC bus 38 (e.g., +300V and −300V). Difference amplifier 44 may receive as input $V_+$ and $V_-$ (based on the values of $HV_+$ and $HV_-$) and output a value $HV_{bus}$ indicative of the total DC bus voltage (e.g., 600V). Signal processor 50 may, in turn, calculate a the balance of DC bus 38, which may be used to set a threshold voltage and/or range for threshold detector 48 or other faults based on $HV_{bus}$. For example, the balance of DC bus 38 may be calculated by a comparison of $HV_{bus}$ and $V+_{avg}$ using the following equation:

$$HV_{balance\%} = 1 - ((HV_{bus} - V_{+avg})/(HV_{bus}/2))$$  Eq. 1.

Averaging function 46 may include any means to average an input value over time and to output a value indicative of the average (e.g., a hardware or software function, such as a filter). Averaging function 46 may receive $V_+$ from DC bus 38 as input and output an average thereof, $V_{+avg}$. For example, averaging function 46 may include a low-pass filter (not shown) to remove high-frequency voltage components from $V_+$. That is, averaging function 46 may pass only the voltage deviations of $V_+$ below a certain frequency. Further, averaging function 46 may include a buffer (not shown) having a high input impedance to prevent DC bus 38 from being unduly loaded by averaging function 46 (if a hardware function). The output of averaging function 46, $V_{+avg}$, may be provided to threshold detector 48 and signal processor 50.

With further reference to FIG. 4, threshold detector 48 may include any means to output an indication of whether the difference between a first value and a second value falls above or below a threshold (e.g., an A/D converter and a software function, a comparator, etc.). A fault in a winding 32 of generator 20 and/or motor 22 may be indicated by $HV_+$ and/or $HV_-$, and, by implication, $V_+$ and/or $V_-$, having a substantial amount of noise. In other words, a winding fault may be present in generator 20 and/or motor 22 if substantial voltage perturbations (i.e., noise) materialize in $HV_+$ and/or $HV_-$, and therefore, $V_+$ and/or $V_-$; particularly if the perturbations contain frequency components corresponding to rotational speeds of generator 20 and/or motor 22. As such, threshold detector 48 may receive as input and compare the voltage levels of $V_+$ and $V_{+avg}$. Threshold detector 48 may output a signal $HV_{+fault}$ indicative of whether a substantial amount of noise is present in $HV_+$ based on the comparison. Specifically, if $V_+$ deviates substantially from $V_{+avg}$, threshold detector 48 may cause $HV_{+fault}$ to have a high voltage level (i.e., "on"), indicating that a fault may be present in at least one winding 32 of generator 20 and/or motor 22. Likewise, if $V_+$ does not deviate substantially from $V_{+avg}$, threshold detector 48 may cause $HV_{+fault}$ to have a low voltage level (i.e., "off"), indicating that no fault is present in windings 32 of generator 20 and/or motor 22.

In one embodiment, threshold detector 48 may cause $HV_{+fault}$ to have a high voltage (i.e., winding fault present) only if the deviation is above a threshold. That is, threshold detector 48 may output a low voltage (i.e., no winding fault present) unless the deviation falls outside a range. For example, threshold detector 48 may be configured to indicate a winding fault if the voltage perturbations are substantial (e.g., greater than +/−50V), $V_+$ deviates from $V_{+avg}$ by a fixed amount (e.g., 10%) or another amount determined by signal processor 50 based on the value of $HV_{balance\%}$ and/or $HV_{bus}$, etc. The threshold/range may be based on known specifications, experimentation, and/or other knowledge about the particular drive train 18. In other words, specific knowledge about the components of drive train 18 may be required in order to ascertain a threshold that indicates a winding failure in generator 20 and/or motor 22. A particular deviation, or difference between $V_+$ and $V_{+avg}$, may or may not indicate a winding fault, depending on the characteristics of the particular generator 20, motor 22, circuit 24, etc. As such, threshold detector 48 may be configurable to indicate a winding fault at a desired threshold. For example, threshold detector 48 may include a comparator and a feedback resistor (not shown) that may be varied or otherwise selected to change the threshold as desired. Alternatively, the threshold may be adjusted during operation by signal processor 50 based on the values of $HV_{balance\%}$ and/or $HV_{bus}$. It is to be appreciated, however, that threshold detector 48 may alternatively or additionally comprise other known means of detecting deviations beyond a desired threshold.

Signal processor 50 may include one or more components configured to receive, store, and/or transmit signals to initiate a precaution in response to various conditions that may arise during operation of drive train 18. In one embodiment, signal processor 50 may receive the outputs of difference amplifier 44 ($HV_{bus}$), averaging function 46 ($V_{+avg}$), and/or threshold detector 48 ($V_{+fault}$). Signal processor 50 may initiate a precaution if DC bus 38 is unbalanced (i.e., $HV_{balance\%}$ is greater than a certain value); and/or if the average voltage of DC bus 38 ($V_{+avg}$) is above or below a certain value.

In another aspect, signal processor 50 may be configured to initiate a precaution when there may be a fault in a winding 32 of generator 20 and/or motor 22 (i.e., $V_{+fault}$ is "on"). As such, signal processor 50 may include, for example, maps, tables, and/or other data storage structures in the computer-readable storage to facilitate fault detection processes in connection with the disclosed control algorithm. The tables may index reference operational parameters and/or characteristics of drive train 18 (e.g., generator speeds, motor speeds, motor load, DC bus voltage, etc.) to indications of whether a winding fault in generator 20 and/or motor 22 is present (e.g., "yes" or "no"). For example, signal processor 50 may include one or more tables indexing generator speeds, motor speeds, motor loads, DC bus voltage levels, etc., to DC bus reference voltage ranges and/or thresholds indicative of a winding fault in generator 20 and/or motor 22. Each index may include and/or be associated with a value indicating whether a fault is present (e.g., "yes" or "no").

The tables may also index generator speeds, motor speeds, motor loads, and/or DC bus voltages levels to reference amplitudes, frequencies, phases, duty-cycles, pulse widths, and/or other bus voltage signal parameters and/or characteristics indicative of a winding fault in generator 20 and/or motor 22. Likewise, each index may include and/or be associated with a value indicating whether a winding fault is present (e.g., "yes" or "no"). The stored data may be based on known specifications, experimentation, and/or other information about the particular drive train 18 (i.e., generator 20, motor 22, circuit 24, etc.). Certain fundamental frequencies corresponding to the rotational speeds of generator 20 and/or motor 22 may materialize on $V_{+fault}$ when a winding fault is present. As such, a frequency component of $V_{+fault}$ may indicate a winding fault in generator 20 and/or motor 22 depending on an angular speed (i.e., a rotational speed) of generator 20 and/or motor 22. In other words, frequency components contained in $V_{+fault}$, when a winding fault in generator 20 and/or motor 22 is present, may correspond to the respective rotational speeds of generator 20 and/or motor 22.

In one embodiment, during operation, signal processor 50 may receive $V_{+fault}$ from DC bus 38. At any time $V_{+fault}$ is a high voltage (i.e., "on"), signal processor 50 may initiate a precaution by generating a precaution command signal. Alternatively or additionally, signal processor 50 may analyze other parameters and/or characteristics of $V_{+fault}$ and compare these parameters and/or characteristics to the reference parameters and/or characteristics in the computer readable storage during operation. For example, signal processor 50 may identify frequency components (e.g., perform a Fourier transform or another frequency spectrum analysis), phases, a duty cycles, pulse widths, etc., of $V_{+fault}$. Signal processor 50 may then look up the identified frequencies, phases, duty cycles, pulse widths, etc., for the current generator speed, motor speed, motor load, and/or DC bus voltage in the tables contained the computer readable storage. Signal processor 50 may then return the associated value (e.g., "yes" or "no"). If the returned value indicates a fault (e.g., "yes"), signal processor 50 may initiate a precaution by generating a precaution command signal. Alternatively or additionally, winding faults may be determined in real-time based on stored equations.

Signal processor 50 may be operatively connected to one or more devices 52 configured to execute precautions initiated by signal processor 50 (i.e., in response to precaution command signals). For instance, devices 52 may include a display device 52a, an audible device 52b, one or more actuators 52c, and/or a machine controller 52d.

Display device 52a may include any device capable of providing a visual warning to an operator of machine 10 in response to a precaution command signal from processor 50. Display device 52a may embody, for instance, a warning lamp, an LCD display, a monitor, an LED, and/or another display device suitable for conveying a warning. Audible device 52b may include any device capable of providing an audio warning to an operator of machine 10 in response to a precaution command signal from processor 50. Audible device 52b may embody, for example, a speaker, a bell, and/or another audio transducer suitable for conveying a warning. In one embodiment, display device 52a and audible device 52b may be operated together to provide a combination audio/visual warning system.

Actuators 52c may include devices configured to produce a mechanical output in response to a precaution command signal from processor 50. For example, actuators 52c may include locking mechanisms adapted to lock and/or restrict access to machine components and/or systems (e.g., generator 20, motor 22, and/or circuit 24) in response to the precaution command signal. Alternatively or additionally, actuators 52c may comprise devices configured to interrupt a circuit and/or power down components or systems of machine 10 in response to the precaution command signal. For instance, actuators 52c may power down, disengage, or otherwise disable generator 20, motor 22, and/or power source 12; open and/or close one or more switches (not shown) to disconnect or otherwise interrupt circuit 24 and/or DC bus 38; and/or perform other operations in response to the precaution command signal.

Still further, signal processor 50 may be configured to communicate with a machine controller 52d. Machine controller 52d may, among other things, record fault events in a machine operation log. For example, machine controller 52d may record DC bus voltage imbalance events, winding fault events, DC bus under-voltage and/or over-voltage events, and/or other machine operation events based on the output from signal processor 50 and/or other components of machine 10. Machine controller 52d may be further configured to communicate the events and/or the contents of the machine operation log to an off-board system (not shown) associated with and/or responsible for tracking operations of machine 10.

One skilled in the art will realize that the processes illustrated in this description may be implemented in a variety of ways and include other modules, programs, applications, scripts, processes, threads, or code sections that may all functionally interrelate with each other to accomplish the individual tasks described above for each module, script, and daemon. For example, these program modules may be implemented using commercially available software tools, using custom object-oriented code written in the C++™ programming language or the Visual Basic™ programming language; using applets written in the Java™ programming language; or may be implemented with discrete electrical components or as one or more hardwired application specific integrated circuits (ASIC) that are custom designed for this purpose.

INDUSTRIAL APPLICABILITY

The disclosed fault detection control system may be useful in situations where it is desirous to detect a winding failure in an electric machine coupled to a DC bus. In particular, the disclosed control system may provide means for detecting a winding failure without equipping the electric machine with special sensors to monitor the electrical performance of the windings, which can be expensive, unreliable, and difficult to implement. By detecting perturbations in the DC bus characteristic of a winding failure, winding failures can be detected without employing additional sensors to monitor the electrical performance of the windings. Operation of fault detection controller 26 will now be discussed.

During machine operation, mechanical power output from power source 12 may rotate generator 20, generating electric power. The electric power may be provided to energize DC bus 38 through converter 34. Motor 22 may receive electrical power from DC bus 38 through inverter 36 and propel machine 10 via traction devices 14.

Concurrently, fault detection controller 26 may continually receive the real-time voltage of DC bus 38 and determine if a winding fault exists in generator 20 and/or motor 22. Specifically, controller 26 may receive a voltage signal $V_+$ indicative of the real-time voltage of DC bus 38, $HV_+$. Controller 26 may average voltage signal $V_+$ over time. Specifically, averaging function 46 may perform a high pass filtering operation to remove low frequency component deviations in $V_+$. Averaging function 46 may output a voltage signal $V_{+avg}$ indicative of the averaged $V_+$ signal.

Controller 26 may compare the real-time voltage of DC bus $HV_+$ to a voltage characteristic known to indicate a fault in a winding 32 of generator 20 and/or motor 22. Specifically, threshold detector 48 may compare $V_{+avg}$ to $V_+$ and determine if a difference therebetween is less than a threshold and/or within a range. For instance, threshold detector 48 may be configured to output a high voltage for $V_{+fault}$ (i.e., indicate a winding fault) when $V_+$ and/or $V_-$ deviates from $V_{+avg}$ by more than a fixed amount (e.g., 10%) or an amount based on the values $HV_{bus}$ and/or $HV_{balance\ \%}$, when substantial perturbations are present on $HV_+$ and/or $HV_-$ (e.g., 50%), etc. Likewise, threshold detector 48 may be configured to output a low voltage for $V_{+fault}$ when $V_+$ is within a fixed amount (e.g., 10%) of $V_{+avg}$ or an amount based on the values of $HV_{bus}$ and/or $HV_{balance\ \%}$, when voltage perturbations on $HV_+$ are not substantial (e.g., less than 50V), etc.

In one scenario, generator 20 and motor 22 may be operating properly, and no winding faults may be present. The voltage perturbations on $HV_+$ may be negligible, and therefore, $V_+$ may be at substantially the same level as $V_{+avg}$. As such, threshold detector may cause $V_{+fault}$ to change to or remain at a low voltage level (i.e., "off"), and no precautions may be taken.

In another scenario, insulation surrounding a winding 32 of generator 20 and/or motor 22 may fail, and winding 32 may contact the frame of machine 10 (i.e., ground 42). As a result, substantial voltage perturbations may materialize on $HV_+$. Threshold detector 48 may detect, for example, that the difference between $V_+$ and $V_{+avg}$ is greater than the fixed amount (e.g., 10%) or an amount based on $HV_{bus}$ and/or $HV_{balance\ \%}$, or that the perturbations present on $HV_+$ are greater than +/−50V, etc., and cause $V_{+fault}$ to change to a high voltage (i.e., "on") in accordance with the perturbations. Further, the perturbations may have frequency component(s) corresponding to the rotational speed of generator 20 and/or motor 22 and/or other characteristics (e.g., phase, pulse width, duty cycle, etc.) indicative of a winding failure.

Concurrently, signal processor 50 may analyze $V_{+fault}$. In one embodiment, signal processor 50 may generate a fault command signal to initiate one of the precautions discussed above upon $V_{+fault}$ changing to a high voltage (i.e., "on"). Alternatively or additionally, signal processor 50 may analyze other signal characteristics of $V_{+fault}$, as discussed above. For example, signal processor 50 analyze the frequency spectrum of $V_{+fault}$ and extract frequency component(s) thereof. Signal processor 50 may then look up the extracted frequency component(s) of $V_{+fault}$ for the current generator speed, motor speed, motor load, DC bus voltage, etc., in the tables contained in the computer readable medium, and return the associated value(s) indicative of whether or not a winding failure is present (e.g., "yes" or "no"). Continuing with the scenario above where a fault is present, the value returned may indicate a winding failure (e.g., "yes"), and signal processor 50 may initiate one of the precautions mentioned above by generating a precaution command signal. For example, signal processor 50 may sound an alarm, display a warning, interrupt and/or disconnect circuit 24, lock access to components and/or systems of machine 10, power down generator 20 and/or motor 22, etc.

By employing the disclosed fault detection controller, winding faults in an electrical machine may be detected without using complex circuitry to monitor the electrical power characteristics of each winding. Instead, the voltage of the DC bus may be monitored for perturbations known to indicate a winding fault, and appropriate precautions may be taken if such perturbations materialize.

It will be apparent to those skilled in the art that various modifications and variations can be made to the disclosed fault detection controller. Other embodiments will be apparent to those skilled in the art from consideration of the specification and practice of the disclosed fault detection system. For example, it is contemplated that the fault detection methods disclosed herein may alternatively or additionally be carried out in the same manner based on the voltage level of $V_+$, $V_-$, $HV_+$, and/or $HV_-$, using hardware, software, and/or firmware, if desired. It is intended that the specification and examples be considered as exemplary only, with a true scope being indicated by the following claims and their equivalents.

What is claimed is:

1. A control system, comprising:
   an electric machine coupled to provide power to or receive power from a DC bus;
   a controller in communication with the electric machine and the DC bus, the controller being configured to:
   receive an indication of a measured voltage of the DC bus;
   average the measured voltage of the DC bus over a period of time;
   determine a difference between the average voltage of the DC bus and the measured voltage of the DC bus;
   determine, based on the difference between the average voltage of the DC bus and the measured voltage of the DC bus, whether to indicate a fault of at least one winding of the electric machine; and
   when it is determined to indicate a fault of at least one winding of the electric machine, generate a signal to initiate a precaution.

2. The control system of claim 1, wherein the electric machine includes one of a motor, a generator, and a motor/generator.

3. The control system of claim 1, wherein the controller is configured to determine whether to indicate a fault of at least one winding the electric machine based on whether a difference between the measured voltage of the DC bus and the average voltage of the DC bus is more than a predetermined voltage.

4. The control system of claim 1, wherein the fault includes a short of the at least one winding to ground.

5. The control system of claim 1, wherein initiating a precaution includes at least one of activating an alarm, powering down the electric machine, or interrupting a circuit.

6. A method for detecting a winding fault, comprising:
   providing power to or receiving power from an electric machine via a DC bus;
   receiving an indication of a measured voltage of the DC bus;
   averaging the measured voltage of the DC bus over a period of time;
   determining a difference between the average voltage of the DC bus and the measured voltage of the DC bus;
   indicating a fault of at least one winding of the electric machine based on the determined difference between the average voltage of the DC bus and the measured voltage of the DC bus; and
   responsive to an indication of a fault of at least one winding of the electric machine, generating a signal to initiate a precaution.

7. The method of claim 6, wherein the electric machine includes one of a motor, a generator, and a motor/generator.

8. The method of claim 6, wherein a fault of at least one winding of the electric machine is indicated when the difference between the average voltage of the DC bus and the measured voltage of the DC bus is more than a predetermined voltage.

9. The method of claim 6, wherein the fault includes a short of the at least one winding to ground.

10. The method of claim 6, wherein initiating a precaution includes at least one of activating an alarm, powering down the electric machine, or interrupting a circuit.

11. A machine, comprising:
a combustion engine configured to power operations of the machine;
a motor arranged to move the machine;
a generator coupled to receive a mechanical power input from the combustion engine, and provide electrical power output through a DC bus to the motor; and
a controller in communication with the generator, the motor, and the DC bus, the controller being configured to:
receive an indication of a measured voltage of the DC bus;
average the measured voltage of the DC bus over a period of time;
determine a difference between the average voltage of the DC bus and the measured voltage of the DC bus;
determine whether to indicate a winding fault of at least one of the motor and the generator based on the determined difference between the average voltage of the DC bus and the measured voltage of the DC bus; and
generate a signal to initiate a precaution responsive to a determination to indicate a winding fault of at least one of the motor and the generator.

12. The machine of claim 11, wherein the controller is configured to determine whether to indicate a winding fault based on whether the difference between the measured voltage of the DC bus and the averaged voltage of the DC bus is more than a predetermined voltage.

13. The machine of claim 11, wherein the fault includes a short of the at least one winding to ground.

14. The machine of claim 11, wherein initiating a precaution includes at least one of activating an alarm, powering down the electric machine, or interrupting a circuit.

15. A method for detecting a winding fault, comprising:
providing power to or receiving power from an electric machine via a DC bus;
receiving an indication of a measured voltage of the DC bus;
averaging the measured voltage of the DC bus over a period of time;
identifying a fault of at least one winding of the electric machine based on:
(1) the measured voltage of the DC bus, and
(2) the average voltage of the DC bus; and
generating a signal to initiate a precaution when a fault of at least one winding of the electric machine is identified.

16. A fault detection system for detecting a winding fault in an electric machine providing power to or receiving power from a DC bus, the system comprising:
an averaging unit configured to receive a measured voltage of the DC bus, and to determine an average of the measured voltage of the DC bus over a period of time;
a threshold detector configured to provide a threshold signal indicating when a difference between the average voltage of the DC bus and the measured voltage of the DC bus is greater than a threshold voltage; and
a signal processor configured to identify a fault in the winding of the electric machine based on the threshold signal, and to initiate a precaution when a fault in the winding of the electric machine is identified.

17. The fault detection system of claim 16, wherein the averaging unit is a low pass filter.

\* \* \* \* \*